(12) United States Patent
LV

(10) Patent No.: US 9,414,507 B2
(45) Date of Patent: Aug. 9, 2016

(54) SPLICING FRAME OF FLAT PANEL DISPLAY

(71) Applicant: SHENZHEN CHINA STAR OPTOELECTRONICS TECHNOLOGY CO., LTD., Shenzhen, Guangdong (CN)

(72) Inventor: Chengling LV, Guangdong (CN)

( * ) Notice: Subject to any disclaimer, the term of this patent is extended or adjusted under 35 U.S.C. 154(b) by 0 days.

(21) Appl. No.: 14/008,404

(22) PCT Filed: Jun. 29, 2013

(86) PCT No.: PCT/CN2013/078529
§ 371 (c)(1),
(2) Date: Sep. 27, 2013

(87) PCT Pub. No.: WO2014/194544
PCT Pub. Date: Dec. 11, 2014

(65) Prior Publication Data
US 2016/0081210 A1  Mar. 17, 2016

(30) Foreign Application Priority Data

Jun. 7, 2013  (CN) .................. 2013 2 0328535 U

(51) Int. Cl.
*H05K 5/02* (2006.01)
*G02F 1/1333* (2006.01)
(Continued)

(52) U.S. Cl.
CPC ............ *H05K 5/0217* (2013.01); *F16B 5/0084* (2013.01); *F16B 11/006* (2013.01);
(Continued)

(58) Field of Classification Search
CPC ....... H01L 23/32; H01L 23/562; H01L 24/73; H01L 33/56; H01L 51/524; H04N 5/64; H04N 5/65; Y10T 156/10; Y10T 156/17; Y10T 156/12; Y10T 29/49826; Y10T 29/49947; Y10T 29/53; Y10T 428/24959; Y10T 428/31826; G02F 1/1333; G02F 1/133308; G02F 1/133608; G02F 2202/28; G02F 2001/133314; G02F 2001/133325; G02F 2001/133317; G02F 2001/13332; G02F 2001/133311; G02F 2001/133328; G02F 2201/46; G02F 2201/465; G02F 2201/503; G06F 1/1637; G06F 1/1616; G06F 1/1601; G06F 2200/1634; G09F 19/22; G09F 15/0012; G09F 15/0018
USPC ...................... 349/58, 122; 29/428, 559, 729, 29/897.312; 361/730; 362/633, 632, 634; 428/192, 492, 99
See application file for complete search history.

(56) References Cited

U.S. PATENT DOCUMENTS

| | | | |
|---|---|---|---|
| 7,349,040 B2 * | 3/2008 | Lee .................. | G02F 1/133308 349/58 |
| 2008/0143918 A1 * | 6/2008 | Kim .................. | G02F 1/133608 349/58 |
| 2013/0286320 A1 * | 10/2013 | Kuo .................. | G02F 1/133308 349/58 |

FOREIGN PATENT DOCUMENTS

| CN | 102402052 A | 4/2012 |
|---|---|---|
| CN | 102592510 A | 7/2012 |

(Continued)

OTHER PUBLICATIONS

Du Juan, The International Searching Authority written comments, Mar. 2014, CN.

*Primary Examiner* — Thoi Duong

(57) ABSTRACT

A splicing frame of flat panel display, comprising a plurality of splicing members, the splicing frame is assembled by the splicing members, wherein a gap is limited between the adjoining splicing members, for inserting an elastic member, an adhesive layer is attached between the elastic member and the splicing member for seamless combining with each other. The elastic members are interference fit with the splicing members by its' own elasticity. In addition, an adhesive layer could be attached on the any side of the splicing member for combining the splicing member with the elastic member more stability. For the surface of the elastic member to be more beautiful, some decorative patterns could be formed on the surface of the elastic member.

18 Claims, 2 Drawing Sheets

A

(51) Int. Cl.
  *F16B 5/00* (2006.01)
  *F16B 11/00* (2006.01)
  *H05K 5/00* (2006.01)

(52) U.S. Cl.
  CPC ........ *G02F1/133308* (2013.01); *H05K 5/0017* (2013.01); *H05K 5/02* (2013.01); *G02F 2001/133328* (2013.01); *G02F 2201/46* (2013.01)

(56) References Cited

FOREIGN PATENT DOCUMENTS

| | | | |
|---|---|---|---|
| CN | 102625624 | A | 8/2012 |
| CN | 2024136467 | U | 10/2012 |
| CN | 102823338 | A | 12/2012 |
| CN | 102938986 | A | 2/2013 |

\* cited by examiner

SPLICING FRAME OF FLAT PANEL DISPLAY

TECHNICAL FIELD OF THE INVENTION

The present invention relates to an outer frame of a large size module, more particularly relates to a splicing frame of the flat panel display.

BACKGROUND OF THE INVENTION

On the liquid display panel field, the size of the liquid display panel becomes more and more big, the frame becomes narrow and the thickness also becomes thin. So the manufacture requirement of the liquid module and the whole panel would be improved. Therein, with large size liquid display panel (e.g. 75", 84", 110" and so on), the module frame and the whole display panel usually could not be formed to be an integrated structure. So the splicing process is necessary. The common splicing process is transverse splicing and slant splicing. The splicing areas are the four corners areas.

Currently, the designs of the display panel assembling as following: the first design: the front shell of the whole display frame is completely covering the front frame of the module, that is, the front shell is the appearance of the whole display; the second design: the front shell is half-covering or non-covering the front fame of the module, that is, the front fame of the module and the front shell of the whole display frame are the appearance of the whole display together. In the about assembly ways, the demand for the precision of the dimensional tolerance is very high, and a great gap between the two splicing members would seriously affect the appearance of the whole display. Therefore, the actual splicing effect is not good in deed.

SUMMARY OF THE INVENTION

The purpose of the present invention is provided a seamless joint splicing frame of the flat panel display for improving the appearance of the large size liquid module or flat panel display.

The present invention provided a splicing frame of flat panel display, comprising a plurality of splicing members, the splicing frame is assembled by the splicing members, wherein a gap is limited between the adjoining splicing members for inserting an elastic member, an adhesive layer is attached between the elastic member and the splicing member for seamless combining with each other, for avoid the elastic member sliding from the gap. The elastic member and the splicing member are interference fit to each other by elasticity.

Preferably, at least two fasteners are provided for connecting and buckling the adjoining splicing members with each other, the gap is limited between the adjoining splicing members. The fastener is a hook-like shape, which is extended from the end of the splicing member.

Preferably, the adhesive layer is attached between the inner surface of the splicing member and the elastic member.

Preferably, the shape of the elastic member is selected from Z shape, T shape, S shape or strip shape.

Preferably, the shape of the elastic member is the same as that of the gap between the splicing members, and the size of the elastic member is great than the width of the gap.

Preferably, the splicing frame is the whole shell or the front frame of the module of the flat panel display.

The present invention also provided a splicing frame of flat panel display, comprising a plurality of splicing members and connecting members, the connecting members are inserted between the two splicing members for seamless combining with each other.

Compared to the prior art, the splicing panel of the flat display of the present invention provided a plurality of splicing members and some elastic members inserted into the gap between the splicing members. The elastic members are interference fit with the splicing members by its' own elasticity. In addition, an adhesive layer could be attached on the any side of the splicing member for combining the splicing member with the elastic member more stability. At the same time, for the surface of the elastic member to be more beautiful, some decorative patterns could be formed on the surface of the elastic member. Preferably, the shape of the gap 12 likes "Z" shape. The splicing members are crisscross to connect them with each other more closely and enhance the intensity of the splicing frame. The present invention also would deal with the following problems, such as, the mismachining tolerance brings larger gap and reduce the requirement of the size allowance of the splicing member, so that the molding process could be more simply.

DETAILED DESCRIPTION OF PREFERRED EMBODIMENTS

Figure 1:
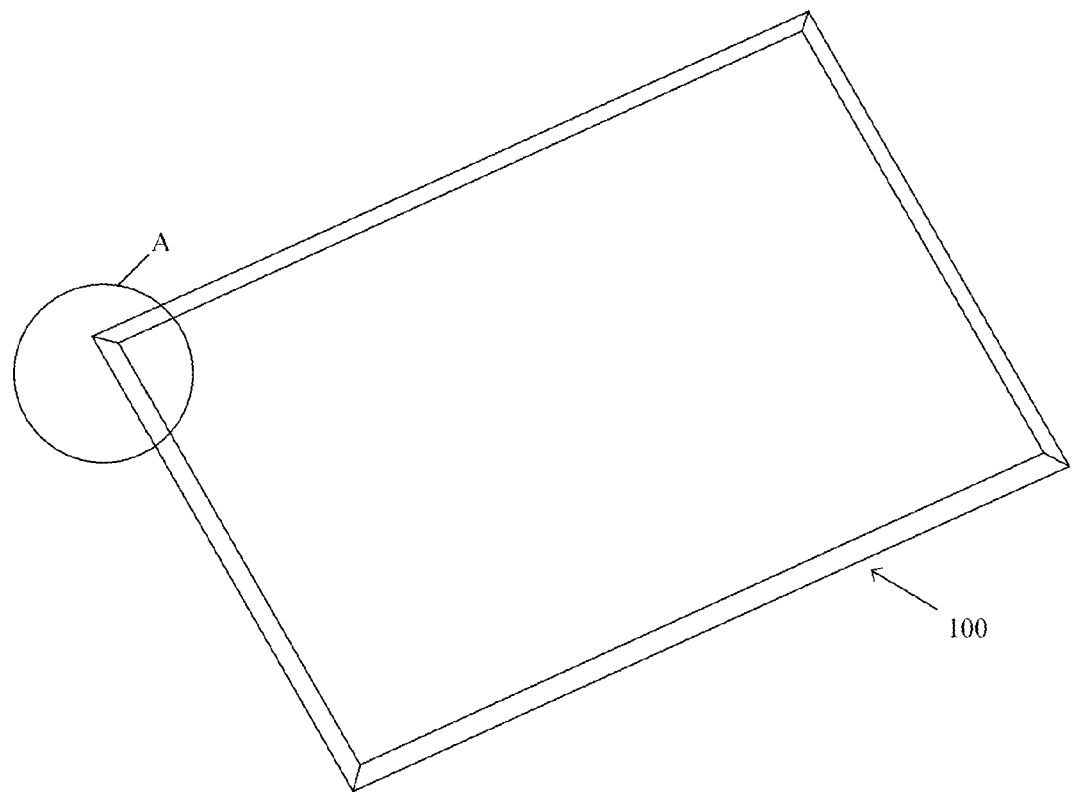
FIG. 1 is a schematic perspective view of a splicing frame of flat panel display according to the present invention.
Figure 2:
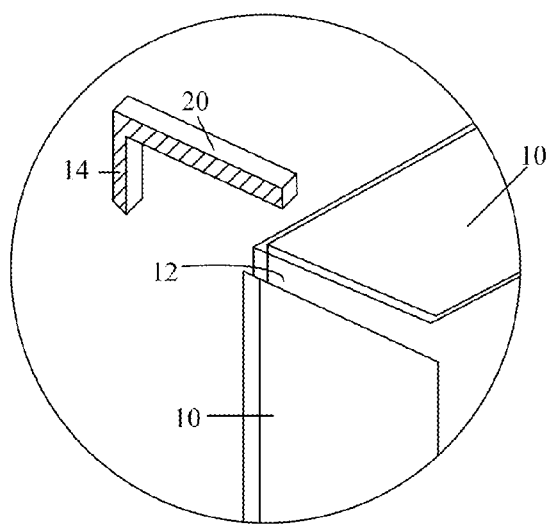
FIG. 2 is an amplify perspective view in A area of a splicing frame of flat panel display according to the present invention.

Refer to FIGS. 1-2, a splicing frame of flat panel display 100 of the present invention comprises a plurality of splicing members 10, the splicing frame 100 is assembled by the splicing members 10. A gap 12 is limited between the adjoining splicing members 10 for inserting an elastic member 20. The splicing frame 100 could be seamless assembled to be a whole with the elastic member 20 filling with the gap 12. The splicing frame 100 is seamless assembled to make it more stability.

Refer to FIG. 2, in the present embodiment, at least two fasteners 16 are provided for connecting and buckling the adjoining splicing members 10 with each other. The four group splicing members 10 are connecting one by one to form the splicing frame 100. The splicing members 10 are bonding together by the fasteners 16. A gap 12 is limited between the adjoining splicing members 16. For avoiding the gap 12 damaging the whole appearance of the splicing frame 100, an elastic member 20 is provided for inserting into the gap 12. The outer surface of the elastic member 20 would be tangency to that of the splicing member 10. Each of the splicing location of the whole splicing frame 100 is seamless to increase the intensity of the splicing frame. In addition, the splicing members 10 could also be assembled together in other ways.

Refer to FIG. 2, an adhesive layer 14 is attached to the joint of the elastic member 20 and the splicing member 10 for seamless combining them. The adhesive layer 14 could be attached to the top or the bottom of the elastic member 20. The adhesive layer 14 is also attached between the inner surface of the splicing member 10 and the elastic member 20. After the elastic member 20 is inserted into the gap 12, the elastic member 20 and the splicing member 10 could be combining more closely for avoiding the elastic 20 sliding from the gap 12.

Figure 3:
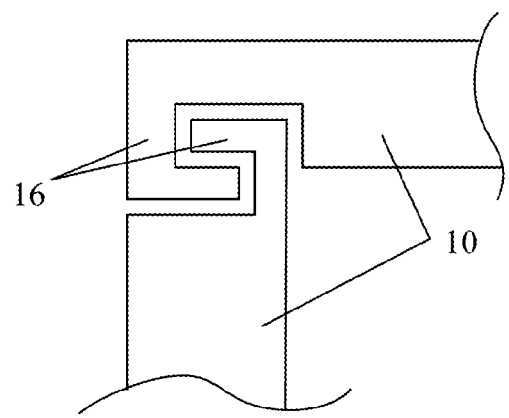
FIG. 3 is a schematic perspective view of non-filling elastic member of a splicing frame of flat panel display according to the present invention.
Figure 4:
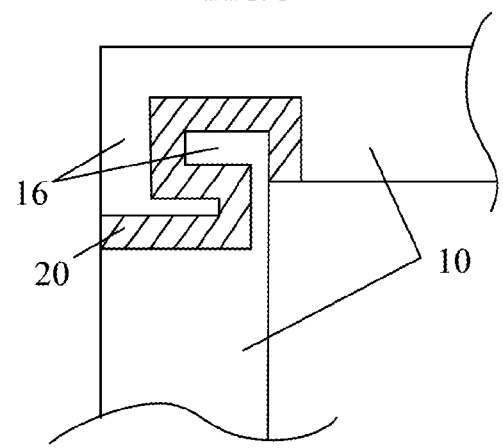
FIG. 4 is a schematic perspective view of filling elastic member of a splicing frame of flat panel display according to the present invention.
Figure 5:
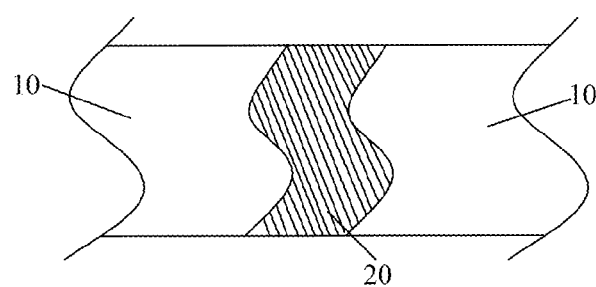
FIG. 5 is a first sectional perspective view of filling elastic member of a splicing frame of flat panel display according to the present invention.
Figure 6:
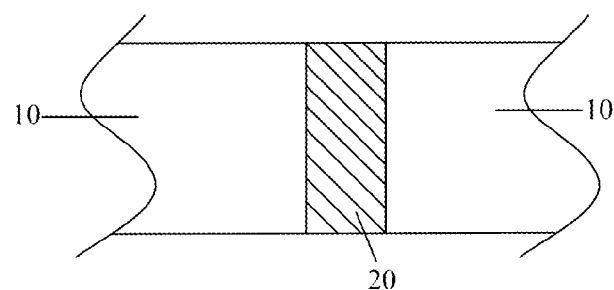
FIG. 6 is a second sectional perspective view of filling elastic member of a splicing frame of flat panel display according to the present invention.

Refer to FIGS. 3-4, the fastener 16 is a hook-like shape which is extended from the end of the splicing member 10. The splicing members 10 are connecting together with the linking fasteners 16. The shape of the gap 12 likes "Z" shape. The splicing members 10 are crisscross to connect them with each other more closely. The elastic members 20 are to be contrapuntal inserted into the gap 12, so that the space of dislocation of the adjoining splicing members would be reduced and the splicing strength would be enhanced. In another embodiment of the present invention, refer to the FIGS. 5-6, the elastic member 20 could be selected from T shape, S shape or strip shape and so on. The elastic member is inserted into the gap 12 between the splicing members 10 for each joint is seamless combining together. That is to say, the elastic member 20 could be molding any shape so long as adapt the shape of the gap 12.

In the present invention, the elastic member 20 could be selected from the thermoplastic resin or silica gel. The shape of the elastic member 20 is the same as that of the splicing member 10, and the size of the elastic member 20 is great than that of the gap 12. Additional, the elastic member 20 and the splicing member 10 could be more closely with interference fit.

For the surface of the elastic member 20 to be more beautiful, some decorative patterns could be formed on the surface of the elastic member 20.

In the present invention, the splicing frame 100 is the outer shell of the display panel or the other large size splicing panel. For example, the splicing frame is the whole shell or the front frame of the module of the flat panel display.

A splicing frame of flat panel display 100 of the present invention also comprises a plurality of splicing members and connecting members, the connecting members are inserted between the two splicing members for seamless combining with each other. The connecting member could be selected from elastic member.

After the assembling of the splicing panel of the flat display, the elastic member 20 is inserted into the gap 12 by forcing, and then the outer surface of the elastic member 20 would be tangency to that of the splicing member 10. The elastic member 20 and the splicing member 10 could be more closely with an interference fit because the size of the elastic member 20 is a little bigger than the width of gap. As a result, the splicing panel 100 is seamless connecting to a whole panel. The elastic member 20 and the splicing member 10 are bonding together more closely with the adhesive layer 14 which is attached to any side of the elastic member 20 or the splicing member 10, so as to avoid the elastic member 20 sliding from the gap 12. In addition, with some surface machining technology such as the wire drawing, polishing, plating and so on, the outer surface of the elastic member 20 could be present a grain pattern to make the splicing panel more artistic and beautiful. The present invention also would deal with the following problems, such as, the mis-machining tolerance brings larger gap and reduce the requirement of the size allowance of the splicing member, so that the molding process could be more simply.

What is claimed is:

1. A splicing frame of flat panel display, comprising a plurality of splicing members, the splicing frame is assembled by the splicing members, wherein a gap is limited between the adjoining splicing members for inserting an elastic member, an adhesive layer is attached between the elastic member and the splicing member for seamless combining with each other.

2. The splicing frame of flat panel display of claim 1, wherein at least two fasteners are provided for connecting and buckling the adjoining splicing members with each other, the gap is limited between the adjoining splicing members.

3. The splicing frame of flat panel display of claim 2, wherein the fastener is a hook-like shape.

4. The splicing frame of flat panel display of claim 3, wherein the fastener is extended from the end of the splicing member.

5. The splicing frame of flat panel display of claim 3, wherein the shape of the elastic member is the same as that of the gap between the splicing members.

6. The splicing frame of flat panel display of claim 5, wherein the size of the elastic member is greater than the width of the gap.

7. The splicing frame of flat panel display of claim 5, wherein the shape of the elastic member is selected from Z shape, T shape, S shape or strip shape.

8. The splicing frame of flat panel display of claim 5, wherein the adhesive layer is attached to the top or the bottom of the elastic member.

9. The splicing frame of flat panel display claim 5, wherein the adhesive layer is attached between the inner surface of the splicing member and the elastic member.

10. The splicing frame of flat panel display of claim 1, wherein the splicing frame is the whole shell or the front frame of the module of the flat panel display.

11. A splicing frame of flat panel display comprising a plurality of splicing members and connecting members, the connecting members are inserted between the two splicing members for seamless combining with each other, wherein the connecting member is elastic member, wherein an adhesive layer is provided for attaching between the connecting member and the splicing member for seamless combining together.

12. The splicing frame of flat panel display of claim 11, wherein at least two fasteners are provided for connecting and buckling the adjoining splicing members with each other, the gap is limited between the adjoining splicing members.

13. The splicing frame of flat panel display of claim 12, wherein the fastener is a hook-like shape.

14. The splicing frame of flat panel display of claim 13, wherein the fastener is extended from the end of the splicing member.

15. The splicing frame of flat panel display of claim 11, wherein the shape of the elastic member is the same as that of the gap between the splicing members.

16. The splicing frame of flat panel display of claim 15, wherein the size of the elastic member is greater than the width of the gap.

17. The splicing frame of flat panel display of claim 15, wherein the shape of the elastic member is selected from Z shape, T shape, S shape or strip shape.

18. The splicing frame of flat panel display of claim 11, wherein the adhesive layer is attached between the inner surface of the splicing member and the elastic member.

* * * * *